MOUNTING FOR INTERCHANGEABLE CIRCUIT ELEMENTS

Filed Feb. 4, 1966

INVENTOR
ROBERT A. KRATOCHVIL
BY Bair, Freeman & Molinare
ATTORNEYS

United States Patent Office 3,414,664
Patented Dec. 3, 1968

3,414,664

MOUNTING FOR INTERCHANGEABLE CIRCUIT ELEMENTS

Robert A. Kratochvil, Des Plaines, Ill., assignor to Beltone Electronics Corporation Filed Feb. 4, 1966, Ser. No. 525,055
4 Claims. (Cl. 174—52)

ABSTRACT OF THE DISCLOSURE

A mounting for a "pellet-type" circuit element on a circuit board. A small conductive casing is provided with a contact at one end of the casing and a conductor connecting the contact with a first terminal on the board. A "pellet-type" circuit element is inserted into the casing through an open opposite end until it contacts the contact and the open end is closed by a conductive cap which threadedly engages the open end of the casing. The cap is tightened until it bears against the element and compresses it between the cap and contact thus forming an electrically conductive circuit between the contact, the element, the cap and the casing. The conductive casing includes a conductor for electrically connecting the casing to a second terminal on the board to complete the circuit. Insulation is provided between the element and the casing and the open end of the casing may be mounted in a housing.

*Background of the invention*

This invention relates to miniature electronic components and more particularly, although in its broader aspects not exclusively, to a technique for interchangeably mounting "pellet-type" circuit elements on a circuit board.

In order to adapt an electrical circuit for a particular application, it is often necessary to modify the value of one or more of the connected circuit elements. In a hearing aid, for example, the output power level is normally preset according to the needs of the wearer. Conventionally, this is accomplished by changing one resistor value in an amplifier circuit by a switch or a direct soldering substitution. Because of the small dimensions involved the switch which must be employed is comparatively expensive and direct soldering substitutions are both difficult and time-consuming.

It is accordingly an object of the present invention to modify the characteristics of an electrical circuit by providing means for mounting easily interchangeable circuit elements.

It is the further object of the invention to provide an extremely small mounting arrangement of the type which may be used on miniaturized printed circuit boards.

*Summary of the invention*

In a principal aspect, the present invention takes the form of an arrangement for mounting a selected one of a plurality of interchangeable circuit elements and for making appropriate connections between the selected element and the associated electrical circuit. As contemplated by the invention, the mounting arrangement includes a metallic casing having a threaded conductive opening therein, the opening being sufficiently large to admit the selected element. A conductive contact is positioned within the casing opposite this opening. The contact is insulated from the casing and is adjacent to a passage through the casing. Circuit means including a conductor traversing the passage connects the contact to a first terminal in the electrical circuit. With the circuit element positioned within the casing a conductive metallic cap, which is threaded to mate with the opening, is tightened to compress the circuit element between the contact and the cap. The casing and a second terminal in the circuit are conductively joined to complete the connection. The characteristics of the connected circuit may accordingly be altered by unscrewing the cap, substituting the desired circuit element, and replacing the cap.

These and other objects, features and advantages of the present invention will be more clearly understood following a consideration of the following detailed description.

*Brief description of the drawing*

Reference will frequently be made to the attached drawing in which.

*Description of the preferred embodiments*

Figure 1:
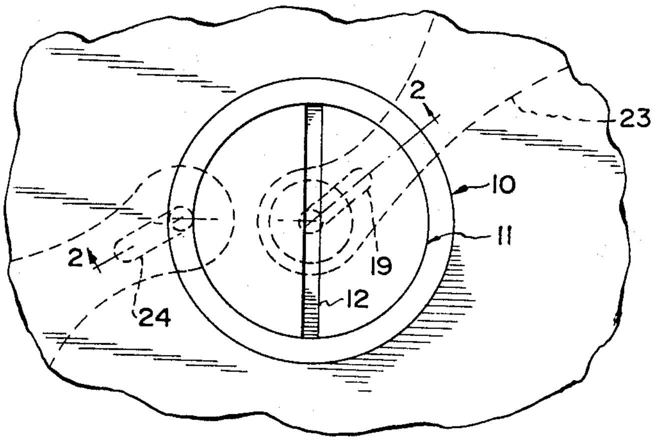
FIG. 1 is a top plan view of an illustrative arrangement for mounting interchangeable "pellet-type" circuit elements on a printed circuit board.
Figure 2:
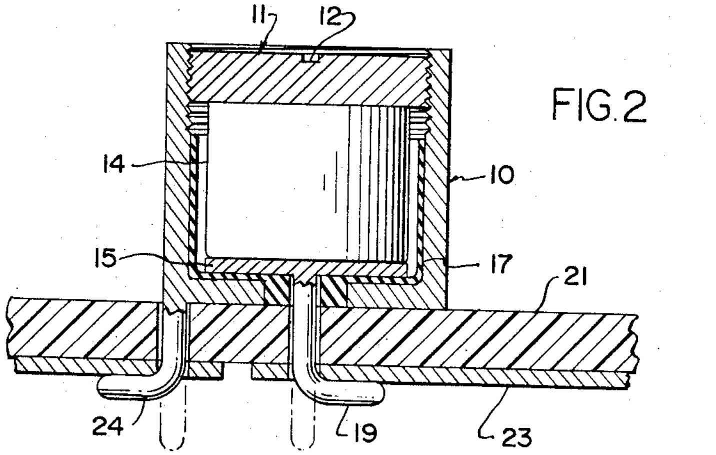
FIG. 2 is a fragmentary cross-sectional view taken substantially along the lines 2—2 of FIGURE 1.

The mounting arrangement shown in FIGURES 1 and 2 of the drawings includes a cylindrical, metallic outer casing shown generally at 10 which is provided with openings at both the top and the bottom. The upper opening is threaded to receive a threaded metal cap 11 which is provided with a transverse screw driver slot 12. By way of example, a pellet-type resistor or capacitor 14 is shown sandwiched between the cap 11 and a contact plate 15. The inserted circuit element may be a resistor, capacitor, inductor, diode, and the like or may comprise a stacked group of elements, an encapsulated module, or other type of circuit device. Both the pellet 14 and the plate 15 are insulated from the metal case 10 by means of an insulating lining 17. A conductive metallic pin 19 is connected to the plate 15 and extends downwardly therefrom through the insulating lining 17, a fibre circuit board 21 and a metallic layer 23. The metallic layer 23 forms a first terminal connection which joins with the associated circuitry. Similarly, a conductive metallic pin 24 extends from the edge of casing 10 downwardly through the circuit board 21 and through a second metallic layer 26. Metallic layer 26 constitutes a second terminal connection for the associated circuit. The pins 19 and 24 may thereafter be bent flat as shown in FIG. 2 against the metallic layers 23 and 26, respectively, where they may be soldered or otherwise bonded together.

As may be readily appreciated, the pellet-type circuit element 14 may be readily removed simply by unscrewing the cap 12. A pellet having a different element value may then be inserted to appropriately modify the operating characteristics of the connected circuit. Pellet-type elements of the type normally permanently connected in an integrated circuit may be used in the mounting arrangements shown in the drawings. These pellet-type circuit elements per se are of standard manufacture and available from a variety of suppliers.

Figure 3:
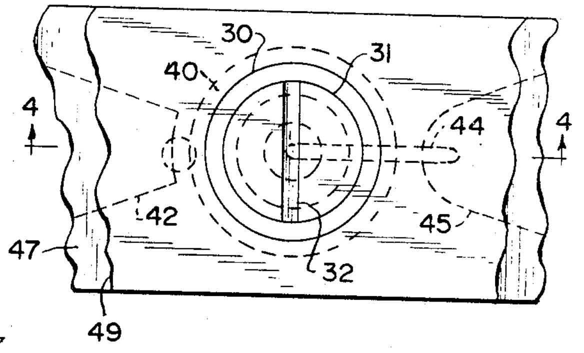
FIG. 3 is a top plan view of an illustrative circuit element mounting arrangement which embodies the principles of the invention and which enables circuit elements to be interchanged without removing the circuit board from the surrounding case.
Figure 4:
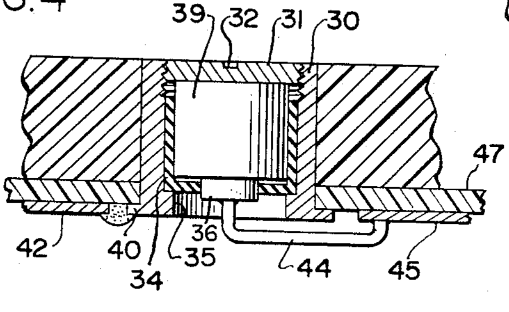
FIG. 4 is a fragmentary cross-sectional view taken substantially along the line 4—4 of FIGURE 3.

The mounting arrangement shown in FIGURES 3 and 4 of the drawings includes a conductive cylindrical outer case 30 which is threaded at the top to receive a threaded cap 31. The cap 31 is provided with a transverse screw driver slot 32. Cap 31 may, of course, be provided with a "Phillips head" slot, extending "hex head" or the like. An insulated liner 34 fits along the inner side walls of the case 30 and is supported at the bottom by an inwardly extending flange 35 of the case 30. A contact 36 is molded within the insulating liner 34 and supports the bottom of the pellet-type resistor or capacitor 39. The case 30 includes an outwardly extending flange 40 which is bonded at one edge of a metallic circuit layer 42. A jumper wire 44 is bonded to connect the contact 36 and a second metallic second layer 45. The cylindrical case 30 extends through the fibre or resin circuit board 47 and an outer case 49, such that the top of the metallic cylinder 30 is flush with the outside surface of case 49. Thus the pellet 39 may be removed and another pellet substituted to alter the characteristics of the circuit without removing the circuit board 47 from the case 49.

The principles of the present invention may be applied to provide an interchangeable mounting for a component or plurality of components having more than two terminal connections. This is readily accomplished by providing multiple contacts on the "floor" of case and providing a keyway or other means to appropriately align the inserted element with the plural contacts.

It is to be understood that the embodiments of the invention which have been described are merely illustrative of an application of the principles of the present invention. Numerous modifications may be made by those skilled in the art without departing from the true spirit and scope of the invention.

What is claimed is:

1. An assembly for placing a selected one of a plurality of interchangeable encapsulated circuit elements in a circuit on an electrical circuit board, comprising:
a conductive metallic casing having a threaded opening therein, said opening being sufficiently large to admit the encapsulated element,
a conductive metallic cap normally threadedly mating with said opening, said conductive cap and said metallic casing being electrically connected to each other,
a conductive contact positioned a predetermined distance from said cap within said casing opposite said opening to compress said encapsulated element in an electrical connection between said cap and said contact when said element is inserted within said casing,
first conductor means passing through a passage in said casing and connected to said contact for electrically connecting said contact to a first terminal on said board, and
second conductor means connected to said conductive metallic casing for electrically connecting said casing to a second terminal on said board.

2. The assembly set forth in claim 1 including, in combination:
a housing comprising a nonconductive outer portion and an inner portion formed by said electrical circuit board, and
an opening in said outer portion of said housing, said metallic casing threaded opening and said cap being mounted in said housing opening.

3. An assembly for interchangeably placing a pellet-type circuit element in circuit on an electrical circuit board, comprising:
a conductive metallic cylinder having circumferential side walls and first and second opposing end walls, said first end wall having a threaded opening therein sufficiently large to admit the pellet-type element into said cylinder, said second end wall having a passage therethrough, an insulating sleeve coaxially mounted within said cylinder along said side walls, a conductive contact member mounted within said cylinder and positioned to electrically contact the pellet-type element when the element is inserted in said cylinder, first conductor means traversing said passage and connected to said contact member for electrically connecting said contact member to a first terminal on the circuit board, means for insulating said contact member and said conductor means from said cylinder, a circular conductive cap threadedly mating with said threaded opening, said conductive cap and said metallic cylinder being electrically connected to each other and said cap being positioned to electrically connect with the pellet-type element when said element is inserted in the cylinder, and second conductor means connected to said metallic cylinder for electrically connecting said cylinder to a second conductive terminal on the circuit board.

4. The assembly set forth in claim 3 including, in combination:
a housing comprising a nonconductive outer portion and an inner portion formed by said electrical circuit board, and
an opening in said outer portion of said housing, said metallic casing threaded opening and said cap being mounted in said housing opening.

References Cited

UNITED STATES PATENTS 2,853,656 9/1958 Dowds ---------- 174—52 XR

DARRELL L. CLAY, *Primary Examiner*.